United States Patent
Ranmuthu et al.

[11] Patent Number: 6,016,077
[45] Date of Patent: Jan. 18, 2000

[54] SYSTEM FOR USER PROGRAMMABLE BANDWIDTH OF AMPLIFIER CIRCUITRY

[75] Inventors: Indumini W. Ranmuthu, Plano; Glenn C. Mayfield, Garland, both of Tex.

[73] Assignee: Texas Instruments Incorporated, Dallas, Tex.

[21] Appl. No.: 09/199,117

[22] Filed: Nov. 24, 1998

Related U.S. Application Data

[60] Provisional application No. 60/080,994, Apr. 7, 1998.

[51] Int. Cl.[7] .................. H03F 3/45; H03F 1/14; H03F 3/16
[52] U.S. Cl. ................... 330/252; 330/292; 330/300
[58] Field of Search .................... 330/252, 260, 330/292, 300

[56] References Cited

U.S. PATENT DOCUMENTS

| | | | |
|---|---|---|---|
| 5,227,681 | 7/1993 | Koyama et al. | 330/300 |
| 5,293,169 | 3/1994 | Baumgartner et al. | 350/51 |
| 5,578,962 | 11/1996 | Rastegar | 330/260 |

*Primary Examiner*—Robert Pascal
*Assistant Examiner*—Patricia T. Nguyen
*Attorney, Agent, or Firm*—W. Daniel Swayze, Jr.; Wade James Brady, III; Richard L. Donaldson

[57] ABSTRACT

A method is disclosed for modifying the operational bandwidth of a signal amplification circuit, comprising the steps of providing an amplification circuit for amplifying the electrical signal, providing circuitry to selectably modify capacitive loading within the amplification circuit and coupled to the amplification circuit, and using the circuitry to selectively modify capacitive loading to alter a dominant pole of the amplification circuit, resulting in a modification of the operational bandwidth of the amplification circuit. A user switchable circuit 220 is coupled to an amplification portion (202, 204, 206, 208, 210, 216, 218) of the amplification circuitry such that a user may selectively activate or deactivate the switchable circuitry, effecting a corresponding and balanced increase or decrease of the capacitive loading within the amplification circuitry. The balanced nature of the capacitive loading changes, effected by the user switchable circuitry, provides the advantage of minimizing the effects of common mode noise and instability in the amplifier circuitry.

13 Claims, 1 Drawing Sheet

SYSTEM FOR USER PROGRAMMABLE BANDWIDTH OF AMPLIFIER CIRCUITRY

This application claims priority under 35 U.S.C. § 119 (e)(1) of provisional patent application No. 60/080,994 filed Apr. 7, 1998.

TECHNICAL FIELD OF THE INVENTION

The present invention relates generally to circuitry for signal amplification and, more particularly, to user programmable adjustments of an amplification circuit's bandwidth to achieve desired performance characteristics.

BACKGROUND OF THE INVENTION

Circuitry performing signal amplification is used extensively in modern electronics. Very often these amplification circuits, or amplifiers, are interposed between a first device that reads or senses a very minute electrical signal and a second device requiring a larger signal.

Conventional methods of signal amplification typically employ one or more stages of circuitry in which a signal is introduced into the circuitry, conducted through one or more gain stages to amplify the signal, and finally output from the circuitry in its amplified form.

As performance and efficiency demands of electronic devices are increased, amplifiers can be optimized to perform with desired operational characteristics. One such characteristic is the operational bandwidth of the amplifier. Operational bandwidth is directly related to other performance characteristics of an amplifier circuit, such as frequency response of the circuit.

SUMMARY OF THE INVENTION

In some applications, optimizing these performance characteristics is essential to the overall efficiency and success of the system. Operational bandwidth of an amplifier circuit may be optimized and altered by various methods. One method of altering the operational bandwidth of an amplifier circuit is changing the capacitive loading within the amplifier circuit. This change to the capacitive loading effects an alteration of a dominant pole in the amplifier circuit, resulting in a modification of the operational bandwidth of the amplifier circuit.

In the past, any given amplifier circuit generally had a fixed capacitive loading based on the design of the circuitry of the amplifier circuit. One problem faced by designers utilizing such amplifier circuitry is that when an amplifier circuit with a different operational bandwidth is required, an entirely different amplifier circuit must be employed. In order to obtain an amplifier circuit with a different operational bandwidth, designers have employed a new and different amplifier circuit or modified the existing amplifier circuit. Where designers have required a range of operating bandwidths, they utilized multiple amplifier circuits. It is herein recognized that it is desirable to provide a single amplifier circuit with a range of operating bandwidths, selectable by the user without requiring redesign of the amplifier circuit.

Some designers may require periodic or continuous adjustments to the operating bandwidth of the amplifier circuitry. It is thereby further desirable to provide a single amplifier circuit with a range of user-selectable operating bandwidths capable of repeated adjustments, providing a user the ability to "program" the desired bandwidth.

Furthermore, based on the complexity and nature of the amplifier circuit, various options for modifying the capacitive loading of the amplifier circuit exist. Conventional methods for modifying capacitive loading within an amplifier circuit present problems in the case of specialized function amplifier circuits. Conventional methods for modifying capacitive loading may introduce noise and instability to the electrical signal being amplified. It is thereby desirable to alter the capacitive loading in such a way that it minimized or eliminates the effects of noise of instability in the amplified circuit.

Also, alteration of the capacitive loading within the amplifier circuit may produce less than optimal results. For example, in a multi-stage amplifier circuit, it is desirable to alter the capacitive loading at a stage having substantial gain. Altering capacitance at an earlier stage will increase the likelihood of the introduction of noise and instability to the electrical signal; while altering capacitance at a later stage, having nominal gain, will reduce the effectiveness of the bandwidth modification and introduce the chance of noise and instability introduction to the electrical signal. It is thereby desirable to alter the capacitance at a stage having substantial gain where immunity from noise and instability problems is realized.

The present invention overcomes the aforementioned limitations of current methods by a system that provides user selectable capacitive loads within the amplifier circuits; optimizing benefit from the gain of the amplifier circuit while greatly reducing noise and instability in the signal.

The invention provides a method of creating a signal amplification circuit having user-selectable bandwidth and circuitry incorporating this method. An amplification circuit is provided. User-switchable circuitry is coupled to an amplification portion of the amplification circuitry such that a user may selectively activate or deactivate the switchable circuitry, effecting a corresponding and balanced increase or decrease of the capacitive loading within the amplification circuitry. This modification of the capacitive loading alters a dominant pole of the amplification circuit, resulting in an adjustment of the operational bandwidth of the amplification circuit.

More particularly, a plurality of switchable circuits are preferably coupled to the amplification circuit providing a range of selectable capacitive loads and, subsequently, operational bandwidths for user selection. The switchable circuits are preferably coupled to the amplification circuitry in such a way that user selection may occur repetitively and at irregular intervals.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION.

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention allows a user to selectively alter the operational bandwidth of an amplifier circuit. User programmed inputs activate circuitry that alters the capacitive loading of an amplifier circuit, thereby affecting the RC time constant of the circuit and resulting, as is known to those skilled in the art, in a corresponding alteration of the operational bandwidth of the amplifier circuit.

As will be apparent to one skilled in the art, the present invention may be employed with a number of operational amplifier circuits. The underlying principle of this invention is applicable, and its implementation readily adaptable, in a wide range of signal amplification applications. All such embodiments are comprehended by the present invention.

Figure 1:
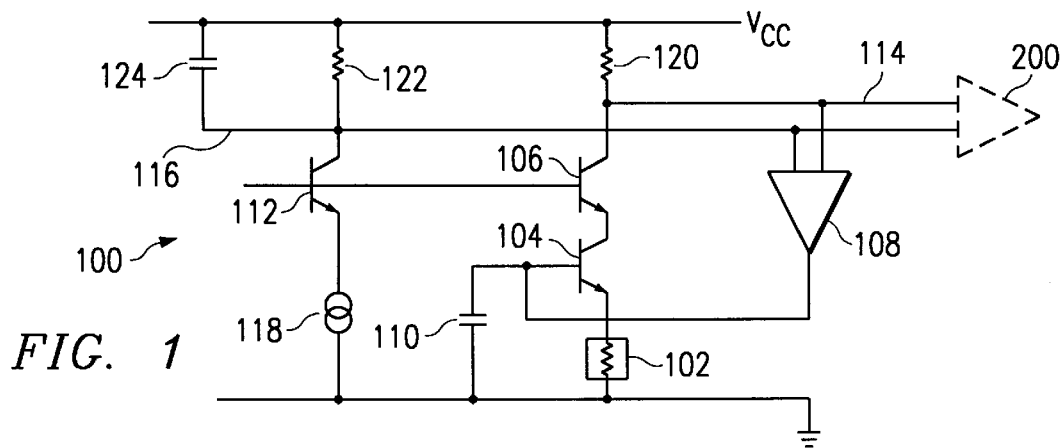
FIG. 1 is an illustrative embodiment of a first stage of an amplifier circuit with a signal input incorporated therein.
Figure 2:
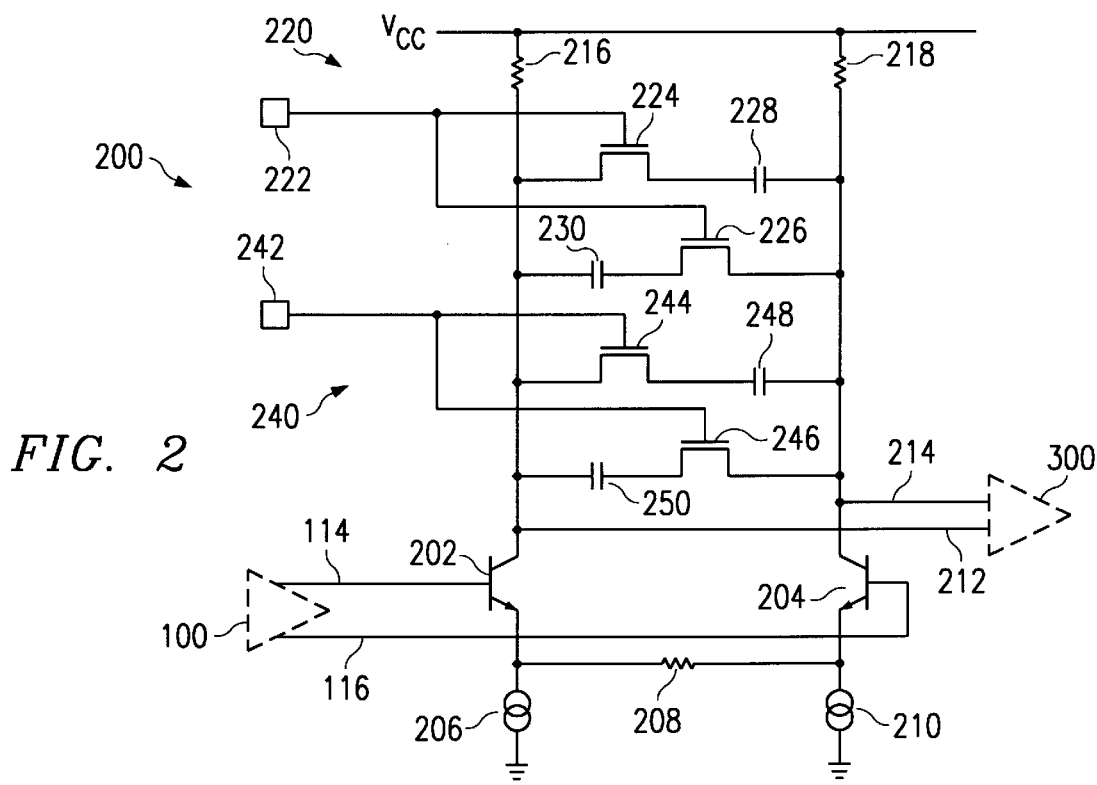
FIG. 2 is an illustrative embodiment of a second stage amplifier circuit incorporating circuitry for selectively altering the capacitive loads of the amplifier circuits.
Figure 3:
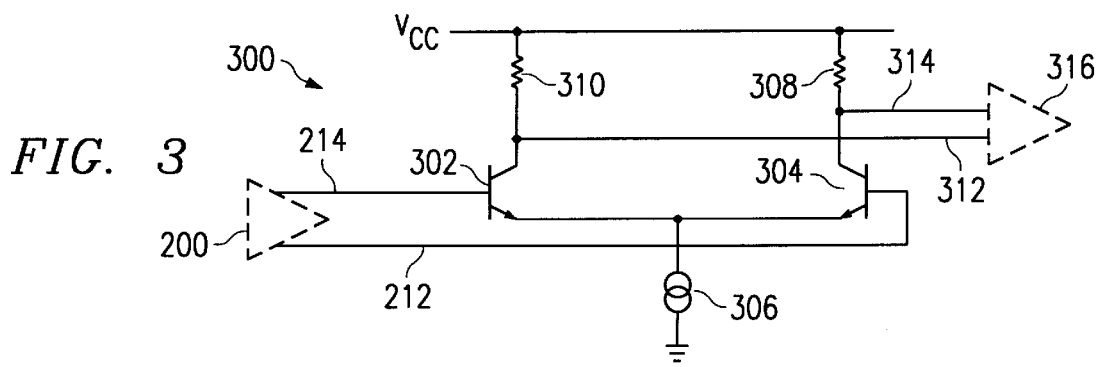
FIG. 3 is an illustrative embodiment of a third stage of an amplifier circuit.

For purposes of illustration, FIGS. 1 through 3 depict the present invention in conjunction with a three stage differential amplifier. Referring now to FIG. 1, an illustrative portion of first stage 100 of the amplifier circuit is depicted. Circuitry for receiving or reading an electrical signal, along with circuitry for converting the signal from single-ended to differential and performing some initial amplification is incorporated in to this diagram. An electrical sensing (or reading) means 102 is coupled at a first end to the emitter of transistor 104 and coupled at a second end to ground. The collector of transistor 104 is coupled to the emitter of transistor 106, and the base of transistor 104 is coupled jointly to the output of transconductance 108 and to a first end of capacitor 110. Capacitor 110 is coupled at a second end to ground. Transistor 106 is coupled at its base to the base of transistor 112, and at its collector to lead 114. Transconductance 108 has inputs coupled to lead 114 and to lead 116. Transistor 112 is coupled at its collector to lead 116, and at its emitter to a first end of current source 118. Current source 118 couples at a second end to ground. Resistor 120 is coupled at a first end to V(cc) and at a second end to lead 114. Resistor 122 is coupled at a first end to V(cc) and at a second end to lead 116. Capacitor 124 is coupled at a first end to V(cc) and at a second end to lead 116. Leads 114 and 116 connect to second stage 200.

As an electrical signal is input via element 102, that signal is transmitted onto second stage 200, differentially, by leads 114 and 116.

Referring now to FIG. 2, an illustrative portion of second stage 200 of the amplifier circuit is depicted. Leads 114 and 116 from first stage 100 connect to the bases of transistors 202 and 204, respectively. The emitter of transistor 202 couples jointly to a first end of current source 206 and to a first end of resistor 208. Current source 206 is coupled at a second end to ground. Transistor 204 couples at its emitter jointly to a second end of resistor 208 and to a first end of current source 210. A second end of current source 210 couples to ground. The collectors of transistors 202 and 204 are coupled to leads 212 and 214, respectively. Resistor 216 is coupled at a first end to lead 212 and at a second end to V(cc). Resistor 218 is coupled at a first end to lead 214 and at a second end to V(cc) Transistors 202 and 204, resistors 208, 216 and 218, and current sources 206 and 210 comprise a differential amplifier.

Connected to that differential amplifier is users switchable circuit 220. Circuit 220 comprises input 222, switching elements 224 and 226, and capacitive elements 228 and 230.

Within circuit 220, input 222 couples jointly to switching elements 224 and 226. Element 224 is coupled at a first end to lead 212, and at a second end to a first end of capacitive element 228. Element 228 is coupled at second end to lead 214. Element 226 is coupled at a first end to lead 214, and at second end to a first end of capacitive element 230. Capacitive element 230 is coupled at a second end to lead 212.

User switchable circuit 240 is also coupled to the differential amplifier of second stage 200. Circuit 240 comprises input 242, switching elements 244 and 246, and capacitive elements 248 and 250. Input 242 couples jointly to switching elements 244 and 246. Element 244 is coupled at a first end to lead 212, and at a second end to a first end of capacitive element 248. Element 248 is coupled at second end to lead 214. Element 246 is coupled at a first end to lead 214, and at second end to a first end of capacitive element 250. Capacitive element 250 is coupled at a second end to lead 212.

Leads 212 and 214 carry an amplified differential signal on to third stage 300.

Referring now to FIG. 3, an illustrative portion of third stage 300 of the amplifier circuit is depicted. Leads 212 and 214 transmit a differential electrical signal from second stage 200 into the circuitry of third stage 300. Lead 214 connects to the base of transistor 302, and lead 212 is connects to the base of transistor 304. The emitters of transistor 302 and 304 are coupled together to a first end of current source 306. A second end of current source 306 is coupled to ground. The collectors of transistors 302 and 304 are coupled to leads 312 and 314, respectively. Resistor 308 is coupled at a first end to lead 314, and at a second end to V(cc). Resistor 310 is coupled at a first end to lead 312, and at a second end to V(cc). Leads 312 and 314 transmit the differential electrical signal to output stage 316.

The amplifier circuit of the present invention, as depicted in FIGS. 1–3, operates to: receive an electrical signal and perform single-ended to differential conversion in first stage 100; perform amplification and provide bandwidth reduction in second stage 200; and perform final amplification and output of a differential electrical signal in third stage 300.

Functionally, an electrical signal is received in first stage 100 by element 102 in a single-ended format. That electrical signal is converted from a single ended format to a differential format and transmitted on to second stage 200 by leads 114 and 116. As the now differential electrical signal enters second stage 200 on leads 114 and 116, that electrical signal is amplified by the circuitry of second stage 200.

When a user desires to alter the operational bandwidth of the amplifier circuit, the user may select either circuit 220, circuit 240, or both. By means of input 222, switching elements 224 and 226 may be activated or deactivated as desired. Activating switching elements 224 and 226 increases the capacitive loading of second stage 200. As a result of the unique configuration and connection of circuit 220, this alteration of the capacitive loading is balanced and therefore eliminates introduction of common mode noise into the differential electrical signal. Similarly, by means of input 242, switching elements 244 and 246 may be activated or deactivated as the user desires. Again, the resulting change in capacitive load on circuit 200 will be balanced and eliminate introduction of common mode noise into the differential electrical signal. Circuits 220 and 240 may be activated or deactivated independently or concurrently.

As will be apparent to those skilled in the art, inputs 222 and 242 may be implemented in a number of ways. One embodiment of inputs 222 and 242 comprises controlling inputs 222 and 242 by means of a register into which control signals for those inputs may be programmed by the user. Another embodiment for inputs 222 and 242 comprises connecting those inputs to external signal pins on an integrated circuit. Various other embodiments for control of inputs 222 and 242 will be apparent to those skilled in the art, and are comprehended by the present invention.

One embodiment of switching elements 224, 226, 244, and 246 comprises using MOSFETs (Metal Oxide Semiconductor Field Effect Transistor) as those switching elements. As design requirements dictate, other suitable contrivances known in the art may be used as switching elements. Capacitive elements 228, 230, 248 and 250 may be chosen according to desired operational characteristics. Magnitude of the capacitance of these elements will affect the degree to which the operational bandwidth of the amplifier circuit may be modified. Any suitable switching or capacitive elements may be employed depending on desired operational characteristics and all such possibilities are comprehended by the present invention.

It will also be readily apparent to those skilled in the art that a number of user switchable circuits, such as circuit 220 and circuit 240, may be employed and utilized within the operational amplifier circuit. An embodiment of the present invention as illustrated in FIG. 2 employs two such user switchable circuits, circuits 220 and 240. This embodiment provides the user an ability to program the operational bandwidth of the amplifier circuit as one of four distinct values. By increasing or decreasing the number of user switchable circuits, the number of bandwidths that may be selected is increased or decreased accordingly. The number of bandwidths available for selection is equivalent to $2^N$, where N equals the number of user switchable circuits implemented. It is also possible that if a user desires to implement variable bandwidth adjustments, they may employ further sub-combinations of the described capacitive loading circuits. All such possibilities are comprehended by the present invention.

As a differential electrical signal is amplified by stage 200, the balanced bandwidth modification substantially eliminates common mode noise and instability in the signal. The amplified differential electrical signal is then transmitted via leads 212 and 214 to third stage 300.

The differential electrical signal undergoes a final amplification and is finally transmitted to output circuitry 316 by leads 312 and 314.

While this invention has been described in reference to the illustrative embodiments, this description is not intended to be construed in a limiting sense. Various modifications and combinations of the illustrative embodiments, as well as other embodiments of the invention, will be apparent to persons skilled in the art upon reference to this description. It is therefore intended that the appended claims encompass any such modifications or embodiments.

What is claimed is:

1. Circuitry for amplifying electrical signals comprising:
    input circuitry adapted to receive an electrical signal;
    an amplification circuit for amplifying said electrical signal coupled to said input circuitry, and adapted to output an amplified electrical signal;
    a user switchable circuit coupled to said amplification circuit, and adapted to selectively modify a capacitive load within said amplification circuit;
    a switch input;
    a switching element responsively coupled to said switch input; and
    a capacitive element operatively coupled to said switching element and to said amplification circuit;
    wherein said switching element is a MOSFET, said capacitive element is a capacitor, the gate of said MOSFET is coupled to said switch input, the MOSFET is operatively coupled between a first side of said differential amplifier and said capacitor, and said capacitor is operatively coupled between said MOSFET and a second side of said differential amplifier.

2. The circuitry of claim 1 wherein said amplification circuit further comprises a plurality of sequentially coupled amplification stages.

3. The circuitry of claim 1 wherein said user switchable circuit is coupled to a second of said sequentially coupled amplification stage circuits.

4. The circuitry of claim 1 wherein said amplification circuit is a differential amplifier.

5. The circuitry of claim 1 further comprising a plurality of said user switchable circuits.

6. A method of providing programmable bandwidth in a signal amplification circuit comprising the steps of:
    forming an amplification circuit for amplifying an electrical signal;
    forming a user switchable circuit coupled to said amplification circuit, and adapted to selectably modify a capacitive load within said amplification circuit; and
    programming said user switchable circuit to modify the capacitive load within said amplification circuit;
    wherein the step of forming a user switchable circuit coupled to said amplification circuit, and adapted to selectable modify a capacitive load within said amplification circuit further comprises the steps of:
    forming a switch input;
    forming a switching element responsively coupled to said switch input; and
    forming a capacitive element operatively coupled to said switching element
    and to said amplification circuit;
    wherein the step of forming an amplification circuit for amplifying an electrical signal further comprises providing a differential amplifier circuit;
    wherein the step of providing said switching element further comprises:
    forming a MOSFET;
    coupling the gate of said MOSFET to said switch input; and
    operatively coupling said MOSFET between a first side of said differential amplifier circuit and said capacitive element such that applying said switch input to said MOSFET effects operation of said capacitive element.

7. The method of claim 6 wherein the step of forming an amplification circuit for amplifying an electrical signal further comprises forming a plurality of sequentially coupled amplification stage circuits.

8. the method of claim 6 wherein the step of forming a user switchable circuit coupled to said amplification circuit further comprises coupling said user switchable circuit to a second of said sequentially coupled amplification stage circuits.

9. A method of modifying the bandwidth of a signal amplification circuit, comprising the steps of:
    providing an amplification circuit for amplifying an electrical signal;
    providing circuitry to selectably modify capacitive loading within said amplification circuit, coupled to said amplification circuit; and altering a dominant pole of said amplification circuit using said circuitry to selectably modify capacitive loading within said amplification circuit;

wherein the step of providing circuitry to selectably modify capacitive loading within said amplification circuit further comprises coupling a plurality of user selectable capacitive elements to provide balanced modification of the capacitive loading to said amplification circuit.

10. The method of claim 9 wherein the step of providing an amplification circuit for amplifying an electrical signal further comprises providing a plurality of sequentially coupled amplification stage circuits.

11. The method of claim 9 wherein the step of providing an amplification circuit for amplifying an electrical signal further comprises providing a differential amplifier circuit.

12. The method of claim 11 wherein the step of providing circuitry to selectably modify capacitive loading within said amplification circuit further comprises coupling a plurality of user selectable capacitive elements to said amplification circuit.

13. The method of claim 12 wherein the step of providing circuitry to selectably modify capacitive loading within said amplification circuit further comprises:

providing a MOSFET;

coupling the gate of said MOSFET to a user selectable input; and operatively coupling said MOSFET between a first side of said differential amplifier circuit and a capacitive element such that applying said user selectable input to said MOSFET effects operation of said capacitive element.

* * * * *